United States Patent [19]

Fischer et al.

[11] Patent Number: 5,124,745
[45] Date of Patent: Jun. 23, 1992

[54] APPARATUS FOR THE PRODUCTION OF PRINTING PLATES

[75] Inventors: Hermann Fischer, Augsburg; Walter Heidenreich, Halle, both of Fed. Rep. of Germany

[73] Assignee: Krause-Biagosch GmbH, Bielefeld, Fed. Rep. of Germany

[21] Appl. No.: 604,118

[22] Filed: Oct. 26, 1990

[30] Foreign Application Priority Data

Nov. 10, 1989 [DE] Fed. Rep. of Germany ....... 3937557

[51] Int. Cl.$^5$ ............................................. G03B 27/04
[52] U.S. Cl. ...................................... 355/85; 355/97; 355/99
[58] Field of Search ................. 355/78, 85, 87, 86, 355/97, 99

[56] References Cited

U.S. PATENT DOCUMENTS

| | | | |
|---|---|---|---|
| 4,664,510 | 5/1987 | Weag | 355/86 |
| 4,674,867 | 6/1987 | Kitai et al. | 355/78 |
| 5,055,875 | 10/1991 | Fischer et al. | 355/89 |

*Primary Examiner*—Monroe H. Hayes
*Attorney, Agent, or Firm*—Collard, Roe & Galgano

[57] ABSTRACT

In the context of a device for the production of printing plates comprising a printing down station with a plate table and an associated illuminating means, which station has associated with it a foil receiving means formed preferably by a foil cassette for unprinted foil and preferably a receiving cassette for printed foil, in the case of which the foil to be printed onto an unexposed or blank printing plate is able to be taken from a foil receiving means by means of a moving vacuum frame, is able to be moved onto the blank plate on the plate table and after exposure is able to be discharged, preferably into a receiving cassette, a high rate of plate production and a smooth manner of operation without damaging the foils may be ensured if the foil conveying device has a plurality of vacuum frames moving in circuits which are out of phase with each other.

19 Claims, 4 Drawing Sheets

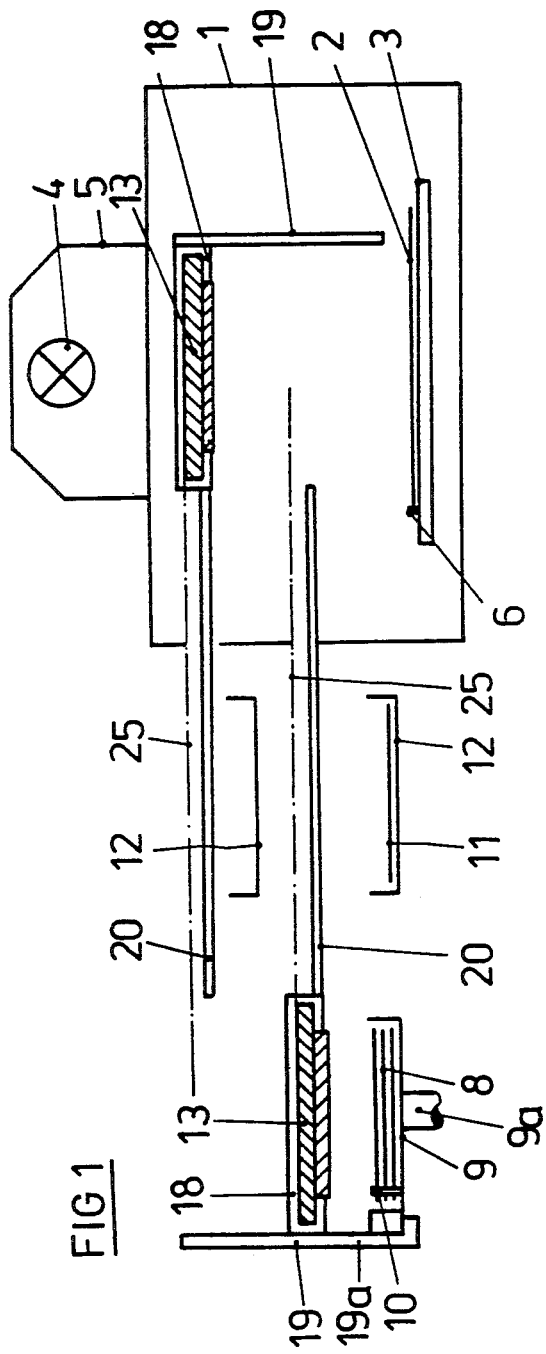
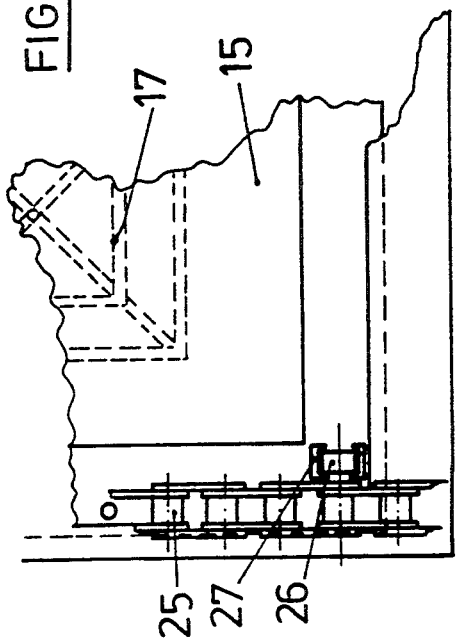
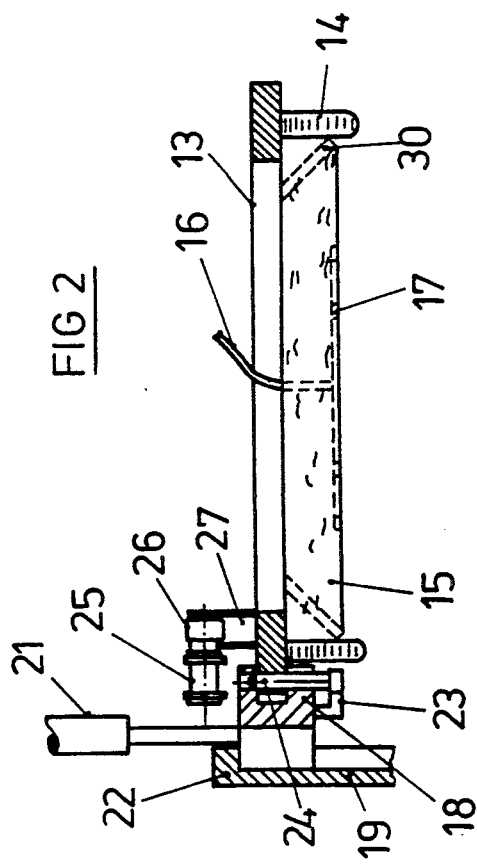

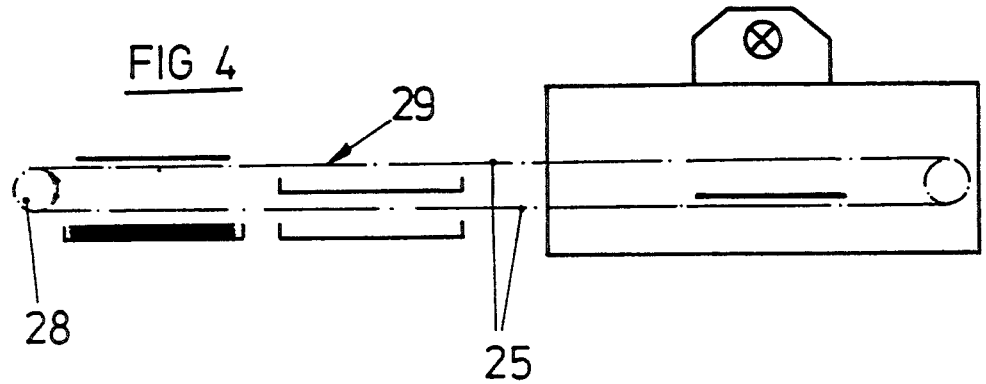
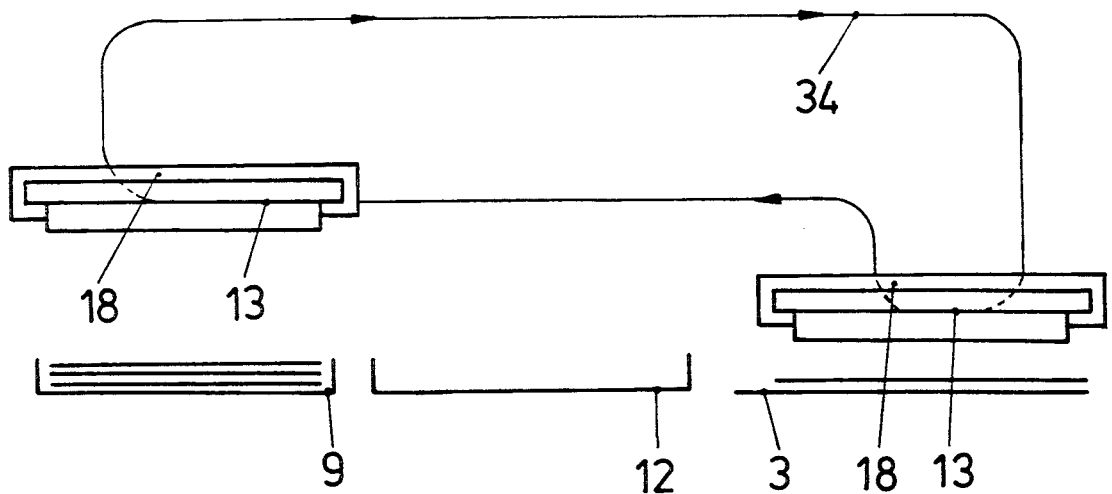

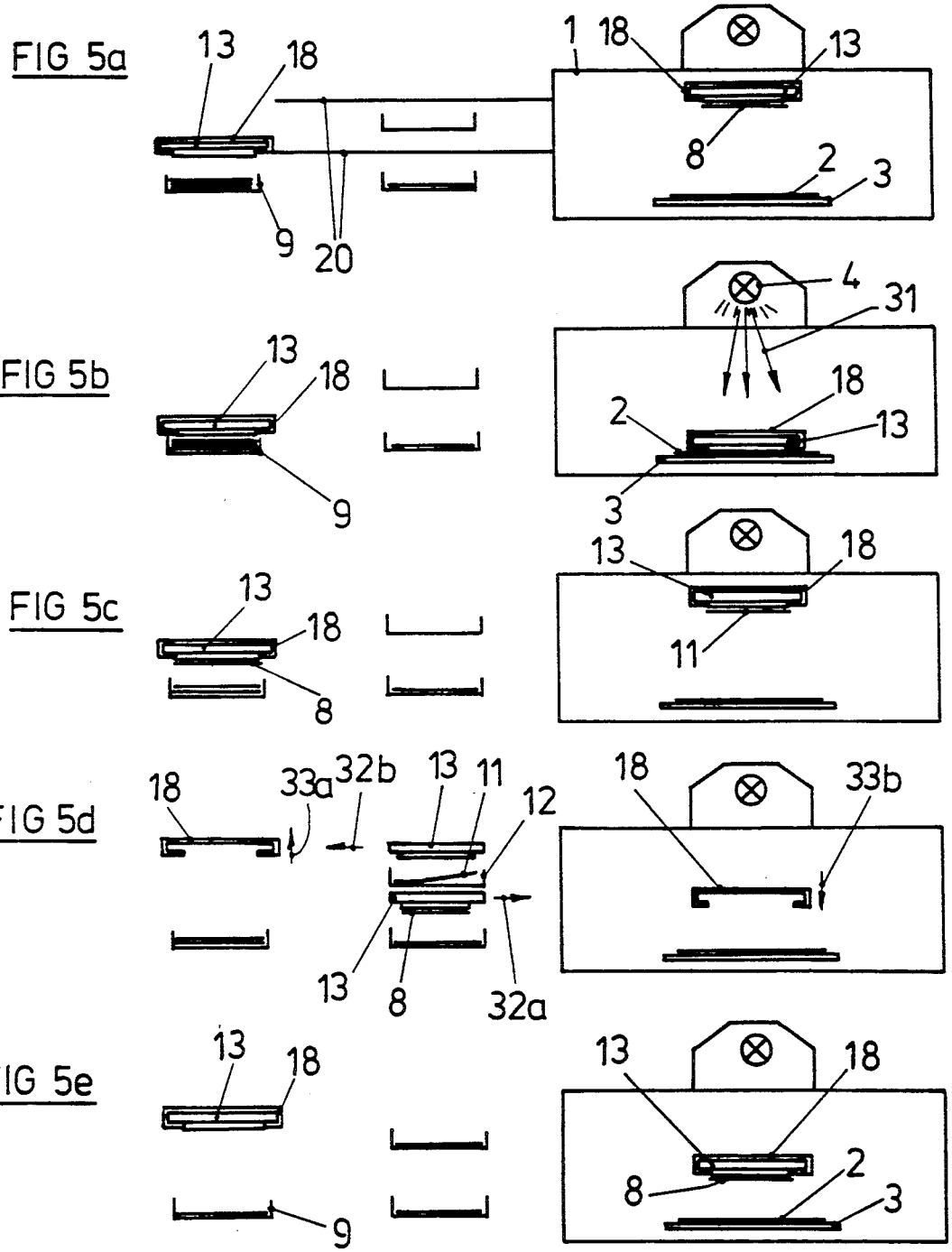

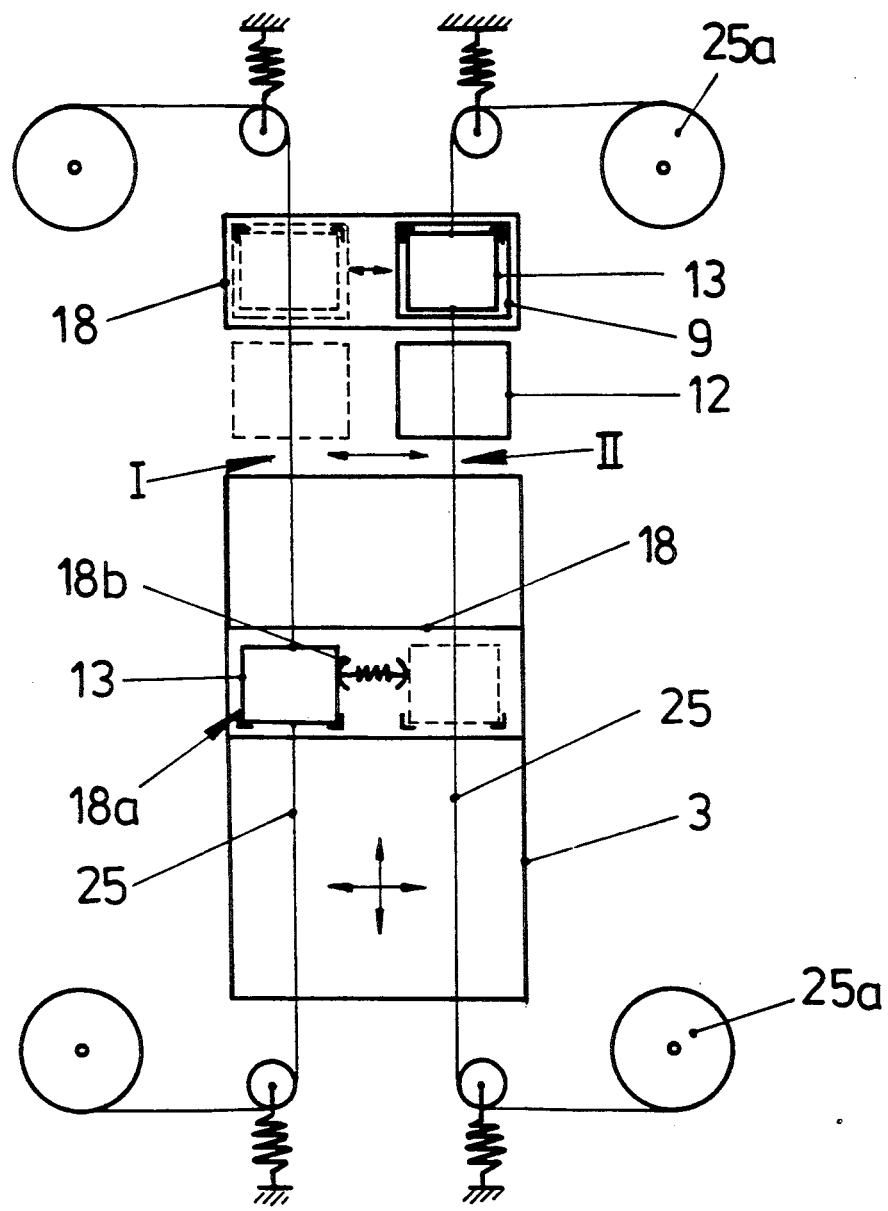

APPARATUS FOR THE PRODUCTION OF PRINTING PLATES

BACKGROUND OF THE INVENTION

The invention relates to an apparatus for the production of printing plates comprising a printing down station with a plate table and an associated illuminating means, which station has associated with it a foil receiving means formed preferably by a foil supply cassette for unprinted foil and preferably a receiving cassette for printed foil, in the case of which the foil to be printed onto an unexposed or blank printing plate is able to be taken from a foil receiving means by means of a moving vacuum frame, is able to be moved onto the blank plate on the plate table and after exposure is able to be discharged, preferably into a receiving cassette.

Such an apparatus is described in the German utility model publication 8,813,594 U, in which a vacuum frame is provided in the printing down station under which the unexposed foil supply cassette is moved for taking and releasing foil which is able to be lowered onto the plate table for printing down, i.e. copying the image of the foil onto the plate. In this known arrangement there is a comparatively long time interval between one printing down operation and the next, since after each printing down operation the one vacuum frame has to run through a complete working cycle, before the next printing down operation is possible. The consequence of this is that the output rate is comparatively low. Although attempts could be made to increase output by increasing the speed of motion, this leads to less reliable operation, to noise and to danger of wear.

The German utility model publication 8,528,934 U describes a further device for the production of printing plates which has a magazine provided with compartments for respective pieces of foil and from which a foil is withdrawn by a first vacuum frame which deposits the foil on a feed table, by which the foil is moved into the copying or printing station where it is transferred to a second frame, which lowers the same on the blank plate. After printing down the foil is transferred from the second frame to a delivery carriage, which puts in the receiving cassette. In this known arrangement the foil accordingly has to be transferred a large number of times from one carriage to another. Such transfer operations do however make the apparatus comparatively slow and the production rate is poor. Furthermore, the transfers of the foil reduce the accuracy of printing and may also lead to a substantial deterioration of the foil.

SHORT SUMMARY OF THE PRESENT INVENTION

Accordingly one object of the present invention is to so improve a device of the initially mentioned type that the time between one printing operation and the next is reduced so that there is an increase in the rate of production.

A still further object of invention is to nevertheless ensure a trouble-free manner of operation.

Another aim is to ensure gentle handling of the foil.

Yet another object of the invention is to ensure high accuracy.

In order to achieve these or other objects appearing from the present specification, claims and drawings, in the present invention a plurality of movable vacuum frames are travellingly arranged between the position of the foil receiving means, which is arranged clear of the plate table and is at a constant distance in relation to the plate table, and the plate table itself, such frames being arranged to move in circuits out of phase in relation to each other so that in each case one vacuum frame is adjacent to the foil receiving means, i.e. the foil cassette, and another vacuum frame is in the printing down station.

These measures ensure that the loading and unloading times, which so far have been purely idle time, are able to be at least partly simultaneous with each other and with the printing down operation since the one vacuum frame is loaded or unloaded and the foil on the other vacuum frame is printed down and vice versa. The printing operations involving alternate use of the one vacuum frame and then of the other one may thus take place in very rapid succession. On the other hand a relatively long time is available for the conveying operations as such so that such manipulation steps may proceed at a relatively gentle pace, this having beneficial effects as regards reliability, noise reduction and elimination of wear. The features in accordance with the invention accordingly involve a higher production rate with reduced mechanical loads and thus ensure excellent production economics.

In accordance with a further possible development of the invention the foil receiving means and the printing table are each provided with an associated frame holder having vacuum frame positioning means and in which the respective incoming vacuum frame may be place in register, which in the position assumed after moving into the respective frame holder is able to be drivingly linked with the associated foil receiving means, i.e. the foil cassette or the like or, respectively, the plate table. These features lead to the advantageous effect of ensuring that during the time between removal from the foil supply cassette and transfer to the receiving cassette each foil remains on the respective vacuum frame associated with it. This ensures not only gentle handling of the foil but furthermore leads to the advantages of a high speed of operation, due on the one hand to the absence of intermediate transfer operations and on the other hand to the possible increase in the speeds of conveyance. Since all the vacuum frames in the two working positions are received in true register, there is no impairment of register despite the necessary translatory motion of the vacuum frames. At the same time it is possible to ensure that the requirements as regards the accuracy of the conveying system are not excessive.

A futher possible feature of the invention is such that the vacuum frame, of which there are preferably two, are arranged on respectively associated guide tracks running in a direction perpendicular to the axis of illumination or exposure in a reversing manner. These features ensure that the vacuum frames are able to move on the same guide tracks during the reciprocating motion, this making it simpler to ensure a simple and reliable support or bearing means and accordingly leading to an improvement as regards the accuracy possible. A further advantage is to be seen in the fact that this feature leads substantially to isolation of the motion of the different vacuum frames, this in turn leading to optimum overlap in the timing of the separate kinetic events.

Further features and advantages of the invention will be gathered from the ensuing detailed description of several embodiments thereof referring to the drawings.

LIST OF THE SEVERAL VIEWS OF THE DRAWINGS.

FIG. 1 is a diagrammatic representation of the printing down machine in accordance with the invention with two vacuum frames able to be moved in reverse.

FIG. 2 shows a section taken through the one vacuum frame holder in the arrangement in accordance with FIG. 1.

FIG. 3 is a plan view of the vacuum frame holder in accordance with FIG. 1.

FIG. 4 shows an example of a drag means as used in the arrangement in accordance with FIG. 1.

FIG. 5a to FIG. 5e represent a diagram of the operation of the arrangement in accordance with FIG. 1.

FIG. 6 is a diagrammatic representation of the printing down or plate making machine in accordance with the invention with vacuum frames arranged to move in a loop.

FIG. 7 is a diagrammatic plan view of a working embodiment with vacuum frame orbits arranged adjacent to each other.

DETAILED DESCRIPTION OF WORKING EMBODIMENTS OF THE INVENTION

The printing down or contact plate making machine illustrated in FIG. 1 comprises a printing down station 1 accommodated in a housing and a plate table 3 to support a blank or unexposed plate 2 and an exposing or illuminating device 4 associated with the table. The illuminating device 4 which is constituted by a lamp, is accommodated in an illuminating head 5 arranged with clearance over the plate table 3. In the present case the illuminating head 5 forms a stationary part of the housing containing the printing down station. In a conventional manner the plate table 3 may be moved in the x and y directions parallel to itself. The blank or unexposed plate 2 to be placed on the plate table 3 is positioned with an accurate register, this being indicated by a register pin 6.

Printing down takes place onto the blank plate 2. For this purpose pieces of foil generally the size of a page are successively placed on the respectively associated part of the blank plate 2 and printed down or contact printed using the illuminating device 4. The foils 8 which have not yet been contact printed are held on standby in the form of a stack with the correct sequence, a foil supply cassette 9 being provided clear of the printing station 1. In the foil cassette the pieces of foil 8 are positioned in register, as is indicated by a register marker pin 6. The pieces of foil 11 already processed are discharged into receiving cassettes 12, which are located in the part between the printing down station 1 and the foil supply cassette 9.

For transfer of the pieces of foil from the foil storage means constituted by the cassettes 9 and 12 to the printing down station 1 and back again, the invention provides two vacuum frames 13 in this case, whose motion through various different positions is so relatively out of phase that, as illustrated, the one vacuum frame may be located in the printing down station 1, while the other one may be adjacent to the foil supply cassette 9 and vice versa. As will best be seen from FIG. 2, the vacuum frames 13 comprise a plate 15 encircled by a surrounding elastic seal 14, the plate 15 being connected via a vacuum duct with a vacuum producing means, there being channels 17 which are open at the surface. The supply of vacuum to the channels 17 makes it possible to suck a foil onto the plate 15 and to hold it thereon. The plate 15 is transparent to light.

For the removal of a foil from the foil supply cassette 9 or, respectively, for placing a foil on the blank plate 3 the respective vacuum frame 13 is caused to cooperate with the foil supply cassette 9, respectively, the plate table 3. In order to ensure high accuracy in this respect the foil supply cassette 9 and, respectively, the printing down station 1 are provided with cooperating frame holders 18, into which in each case the vacuum frame 13 is moved which is to be brought into a cooperating relationship with the foil supply cassette 9 and, respectively, the plate table 3. The frame holders 18 are moved upwards and downwards in a direction parallel to the axis of the illuminating device 4.

In order to design the apparatus with a stationary plate table 3 the inner frame holder 18, which is associated with the plate table 2, may be lowered from both vacuum frame lines as far as the plate table 3. The same operation is possible adjacent to the foil supply cassette 9. In this case the outer vacuum frame holder 18, associated with the foil supply cassette 9, is only to be able to be moved upwards and downwards between the two vacuum frame lines or orbits. For this purpose the foil supply cassette 9 is able to be vertically moved in such a manner that its stack of foils is able to be brought into and out of engagement with the vacuum frame 13 moved into the outer vacuum frame holder 18, such vacuum frame 13 being held in this respect by means of the frame holder 18 in a standby position at the same level as the lower vacuum frame orbit. The motion of the foil supply cassette 9 is such that the decrease in the height of the foil stack is allowed for.

In order to guide the frame holders 18 and, respectively, the foil supply cassette 9 vertical guides 19 and, respectively, 19a are provided which are parallel to the axis of illumination. The foil supply cassette 9 is provided with a vertical drive device 9a. The vertical drive devices associated with the frame holders 18 are indicated in FIG. 2 at 21.

In order to receive the vacuum frames 13 on the orbit between the frame holders 18 there are longitudinal guide tracks 20 placed one above the other with vertical alignment and so as to extend transversely in relation to the exposure axis. Each vacuum frame 13 is provided with its only longitudinal guide track 20. In the illustrated form of the invention there are accordingly two superposed longitudinal guide tracks 20, on which the respectively associated vacuum frame 13 is able to be reciprocated. The rails forming the longitudinal guide tracks 20 end at one end within the printing down station 1 and at the other end adjacent to the foil supply cassette 9 in each case aligned with the facing sides of the frame holders 18 so that the latter may be moved along their vertical guides 19 transversely in relation to the longitudinal guide tracks 20. The running face cross section of the rails constituting the longitudinal guide tracks 20 and the frame holder 18 are in this case identical so that there is a smooth stepless transition if a frame holder 18 is at the same level as a longitudinal guide track 20, this facilitating the entry of the vacuum frames 13 into the frame holders 18. The frame holders 18 and the rails forming the longitudinal guide tracks 20 may in this respect abut end to end with the necessary play to allow motion of the frame holders 18.

The frame holders 18 are each, as may further be seen from FIG. 2, able to be moved by a drive device 21, which has already been mentioned and which in the present case is in the form of a piston and cylinder actuator. These drive devices 21 are so operated that the frame holders 18 are each able to be halted at the same level as the two longitudinal guide tracks 20 in order to be able to move the respective vacuum frames 1 inwards and outwards. The dwell positions aligned with the longitudinal guide tracks 20 of the frame holders 18 may in this respect be defined by detent elements arranged adjacent to their vertical guides 19, as is indicated in FIG. 2 by an abutment 22. The respective vacuum frame 13 moved into a frame holder 18 is arrested on the respective frame holder 18 in proper register. For this purpose the frame holders 18 are, as will further be seen from FIG. 2, provided with respective arresting means, which in the present case are in the form of a register pin 24 actuated by means of an associated setting means 23.

Each longitudinal guide track 20, which is associated with a respective vacuum frame 13, is provided with an associated receiving cassette 12. In the illustrated working embodiment there are accordingly two receiving cassettes 12, which are stationarily arranged under the respectively associated longitudinal guide track 20. The respective foils 11 to be placed in the receiving cassette are ejected by the vacuum frame 13 moving past as it overtakes since the vacuum of the respective vacuum frame 13 turned off. It would naturally also be possible for the vacuum frames 13 to be stopped for a short time for ejecting the items of foil 11 which have already been printed down above the respective receiving cassette 12 and/or to direct compressed air onto it. The foil supply cassette 9 is so offset in an outward direction towards the guide tracks 20 in relation to the adjacent receiving cassette 12 that it is located beyond the outer end of the longitudinal guide tracks 20.

If the single foil supply cassette 9 used here is stationary, it may be at the same level as the lower cassette 12. The vertical guide associated with the outer frame holder 18 extends in this case so far over the lower longitudinal guide 20 that the associated holder 18 is able to be moved from its dwell settings adjacent to the two longitudinal guide tracks 20 and lowered onto the stationary foil supply cassette 9 thereunder. In this case for the purpose of simple allowance of the decrease in the foil stack height the foil supply cassette 9 is however, as already mentioned, able to be lowered from its outer frame holder 18, which is able to be lowered from its lower guide track 20 located at the same level as the internal receiving cassette 12 and which is in any case waiting at this position. The vertical guide 19, associated with the outer frame holder 18, accordingly only extends over the part between the two guide tracks 20. This vertical guide 19 may be adjoined by the vertical guide 19a, associated with the foil supply cassette 9, in a downward direction. The vertical guide 19 associated with the inner frame holder 18, extends down as far as a point adjacent to the plate table 3 so that the respective frame holder 18 is able to be lowered onto the plate table which is arranged so as to stay stationary in the vertical direction. In place of this vertical mobility of the inner frame holder 18 it would be possible, as already noted, for the plate table 3 as well to be arranged so that it might be raised and lowered in such a manner that it would be able to cooperatingly associated with each vacuum frame 13 which is able to be moved to and fro between different levels and moved into the inner frame holder 18.

In order to shift the vacuum frames 13 along the respectively associated longitudinal guide track 20 each longitudinal guide track is provided with a drag device 25 as indicated in broken lines in FIG. 1 and with which the respectively associated vacuum frame 13 may be coupled in such a manner that it is entrained in the longitudinal direction of the longitudinal guide track 20 and may be coupled and uncoupled by vertical motion. In the one end position as moved into a frame holder 18, it is possible, by causing suitable vertical shift of the frame holder 18 to bring about an automatic uncoupling and coupling of the vacuum frame 13 with the respectively associated drag device 25. The drag device 25 may, as is indicated in FIGS. 2 and 3, be formed by drag chains running parallel to the longitudinal guide and on which laterally projecting entraining rollers 26 are attached. The vacuum frames 13 are provided with vertically extending entraining rails 27, which define a vertically extending passage for one respective entraining roller 26. In the case of a vertical motion of the frame holder 18 together with the vacuum frame 13 mounted thereon the entraining roller 26 will move within the passage formed by the entraining rails 27 (which are secured to the frame) or moves into and out of the passage. In the case of a longitudinal motion of the drag device 25 the vacuum frame 13 will be entrained because of its engagement with an entraining rail 27 engaging an entraining roller 26, in the longitudinal direction. In order to avoid collisions between the frame holders 18 and the drag device 26, the lower drag device may be outwardly offset in relation to the upper drag device parallel to the longitudinal direction of the longitudinal guide tracks 20.

The drag devices 25 respectively associated with the superposed longitudinal guide tracks 20 may be in the form of pulling means which are independent from each other and are able to be separately moved. It is more particularly in the case of there being only two vacuum frames 13 that the motion thereof may take place with such an offset that there are simultaneously opposite movements of the vacuum frames 13 adjacent to the longitudinal guide tracks 20. In such a case in order to form the two drag devices 25 it is possible, as shown in FIG. 4, to simply provide an endless loop of traction means 29 running over two bend members 28, so that its upper run forms the drag device associated with the upper longitudinal guide track 20 and whose lower run forms the drag device associated with the lower longitudinal guide track 20. One of the bend members 28 is in this case simply driven with a reversing action so that the desired reciprocating motion of the drag devices 25 is produced.

The manner of operation of the a printing down device in accordance with the invention will best be understood from FIGS. 5a through 5e, in which respect the device shown has a stationary foil supply cassette 9. FIG. 5a shows a situation in which the outer frame holder 18 is in the dwell setting aligned with the lower longitudinal guide track 20 and the inner frame holder 18 is in the dwell setting aligned with the upper longitudinal guide track 20. In the inner frame holder 18 the vacuum frame 13 associated with the upper longitudinal guide frame 20 has been moved inwards, such vacuum frame carrying the foil 8 which has been previously taken from the foil supply cassette 9. The vacuum frame 13 associated with the lower longitudinal guide track 20 has been moved into the outer frame holder 18, such frame 13 not so far having any foil. Then the vacuum frame 13 received in the outer frame holder 18 takes a piece of foil from the foil supply cassette 9. Simultaneously the foil 8 held on the vacuum frame 13 received on the inner frame holder 18 is printed down onto the blank plate 2 placed on the plate table 3. For this purpose, as may be seen from FIG. 5b, the frame holders 18 and the vacuum frames 13 respectively received thereon are lowered onto the foil supply cassette 9 and, respectively, the plate table 3. In order to take an item of foil from the foil supply cassette 9 the vacuum frame 13 mounted in the outer frame holder 18 is put under vacuum. The foil held on the vacuum frame 13 received on the inner frame holder 18 is acted on by vacuum for printing down onto the blank plate 2. For this purpose there are, as may be best seen from FIG. 2, vacuum ducts 30 opening adjacent to the circumferential seal 14, which are connected with the vacuum line for sucking the foil against the blank plate 2, there first being a weak preliminary vacuum and then the full vacuum in a known manner. As a result the space which is delimited at the edge by the circumferential seal between the plate 15 and the blank plate 2 is evacuated so that the plate 15 with the foil held therein is engaged with the blank plate 2, the sealing deforming in a corresponding manner. The exposure of the foil takes place by switching on the illuminating device 4 as is indicated in FIG. 5b by the light beams 31.

In the next step, as is represented in FIG. 5c, there is a return of the outer frame holder 18 together with the vacuum frame 13, carrying a foil 8, into the position aligned with the lower longitudinal guide track 20. The inner frame holder 18 together with the vacuum frame arrested thereon (which carries the foil after printing down) returns into the position aligned with the upper longitudinal guide track 20. In order to detach the foil from the blank plate 20 the vacuum applied through the ducts 30, is broken by motion of the inner frame holder 18. Then, as is indicated in FIG. 5d, there is an exchange in the position of the vacuum frames 13, the vacuum frame 13 associated with the lower longitudinal guide track (which now bears a new foil 8), is moved from the position adjacent to the foil supply cassette 9 into the printing station 1 and in the opposite relative direction the upper vacuum frame 13, associated with the upper longitudinal guide track 20 (carrying the previously printed foil 11), is moved from the printing station 1, as is indicated in FIG. 5d by the direction arrows 32a and 32b. At the same time the empty frame holders 18 move in a vertical direction into the respectively other dwell setting, that is to say in the present case the other frame holder 18 moves in the dwell setting aligned with the upper longitudinal guide track 20 and the inner frame holder 18 moves into the dwell setting aligned with the lower longitudinal guide track 20, as is indicated in FIG. 5d by the direction arrows 33a and 33b. The frame holders 18 accordingly assume a position, in which the vacuum frames arriving on the longitudinal guide tracks 20 in the direction indicated by the arrows 32a and 32b may be received. This situation is to be seen in FIG. 5e. When the upper vacuum frame 13 bearing the printed foil 11 moves past the associated receiving cassette 12 the vacuum applied to this vacuum frame 13 is turned off, the foil 11 then being ejected into the receiving cassette 12 associated with the upper longitudinal guide track 20.

As soon as the vacuum frames 13, as shown in FIG. 53, have moved into the frame holder 18 assuming the associated position, it is possible for the removal of a foil from the foil supply cassette 9 and for the printing down operation to be repeated, the vacuum frame 13 associated with the upper longitudinal guide track taking a new foil 8 from the foil supply cassette 9 and conversely the foil received on the vacuum frame 13 associated with the lower longitudinal being printed down onto the blank plate 2. Each vacuum frame 13 completes, as may be seen from FIGS. 5a through 5e, a working cycle, which practically commences on the removal of a new foil 8 from the foil supply cassette 9 and practically ends again at this position, after the printing down operation has been performed and the printed foil is then transferred to the receiving cassette. The working cycles of the two vacuum frames 13 are in this case out of phase by about a half cycle. Accordingly, as is indicated in FIGS. 5a through 5c, in each case one vacuum frame 13 is in the printing down zone, while the respectively other vacuum frame 13 is clear thereof and vice versa. It is only in the case of a change of postions that the two vacuum frames 13 meet as is shown in FIG. 5d and the frame holders which are simultaneously emptied in this situation, may pass into the respectively new position. Owing to the number of the vacuum frames 13 provided and the mutual phase offset between the cycles there is necessarily a short interval between consecutive printing down operations.

In the illustrated working embodiment the vacuum frames 13 move reversingly on the respectively associated longitudinal guide track from the outside to the inside and back again. The frame holders 18 are accordingly arranged stationary in the longitudinal direction of the longitudinal guide tracks 20 and are only moved vertically along their vertical guides 19. In the design in accordance with FIG. 6, unlike the previous case, the vacuum frames 13 are moved on an endless guide track 34, which runs between the printing down zone, here indicated by the right hand reversal turn, with the plate table 3, and the loading zone, indicated here by the left hand reversal turn, with the foil supply cassette 9 and whose lower returning branch, returning from the printing zone to the loading zone, runs past a receiving cassette 12. Owing to the closed circuit of the guide track 34 in this case only one receiving cassette 12 and one foil supply cassette 9 are required. In the printing zone there is a frame holder 18 which may be lowered from the guide track 34 to the plate table 3, which is may be arranged stationarily in the vertical direction. The same may be provided adjacent to the foil supply cassette 9. However, it would also be possible to arrest the outer frame holder 18 at the same level as the guide track 34 and to cause the foil supply cassette 9 to perform a respective stroke. In each case the vacuum frames 13 are received in the frame holders 18 with true register in this working embodiment.

FIG. 7 shows a working embodiment with reversal of the motion of the vacuum frame. The same reference characters are used as for corresponding parts of the working embodiment of FIG. 1 through 5. The plate table 3 able to move in the x and y directions is straddled by a frame holder 18, which is stationary in the x and y directions and extends over the entire breadth of the table 3 and which has to adjacently placed frame receiving means 18a, in each of which a vacuum frame 13 may be received. In the illustrated working embodiment the left frame receiving means 18a is occupied by a vacuum frame 13. The right frame receiving means is empty. Adjacent to the front end side of the table there is a further frame holder 18 identical to the opposite frame holder on the table side and whose right frame receiving means is at this instant occupied by a vacuum frame 13 and whose left frame receiving means is empty. The outer frame holder 18 straddles a foil supply cassette 9. The positioning of the vacuum frames 13 to be in true register in the frame holders 18 may be under pressure against abutments.

The two vacuum frames 13 able to be alternately moved in the frame holders 18 on the table side and on the outside, are connected with parallel traction means 25, presently in the form of wires or the like, and are moved by the same along two frame conveying lines I and II parallel to each other and which may have associated guide tracks in the form of guide rails. In the illustrated working embodiment there are no guide tracks so that the traction means 25 are simultaneously designed to serve as carrying means. The traction means 25 running adjacent to the frame holders 18 and being parallel between same, run past the two frame holders 18 and then caused to change direction and have their ends secured to take up drums 25a. The take up drum 25a which is respectively to the front in the direction of motion is driven and the rear one is braked.

In order to ensure a gentle engagement of the vacuum frames 13 in the direction of travel against abutments on the frame side under pressure the traction means 25 may be provided with springs or be resiliently cushioned in some other way. Transversely thereto it is possible to have resilient pressing means 18b, which come into engagement with a frame edge.

In the case of the use of guide rails it is possible to achieve an exact positive positioning action by these means even transversely to the direction of travel.

The foil supply cassette 9 straddled by the outer frame holder 18 is able to be reciprocated through a distance equal to the distance between the frame receiving means 18a on the frame holder side so that only one foil supply cassette 9 is required, from which the vacuum frame, which has be respectively moved into the frame holder 18, may take a new foil while nevertheless ensuring a straight course of the traction means 25 and of any guide tracks. Accordingly the foil supply cassette 9 in the working embodiment is in its left position under the vacuum frame 13 moved into the outer frame holder 18. The foil supply cassette 9 has a receiving cassette 12 in front of it, in which the respectively printed foil may be ejected from the vacuum frame 13 moving past. The receiving cassette 12 is, like the foil supply cassette 9, able to be reciprocated so that the machine only requires one receiving cassette. In the illustrated working embodiment the receiving cassette is also in its right position so that the right vacuum frame 13, previously having moved over it, is able to eject the previously printed foil.

After the right vacuum frame 13 has received a new foil the foil supply cassette 9 and the receiving cassette 12 move into the left position, as is indicated by broken lines. The unoccupied frame receiving means are also indicated by broken lines. During the ensuing change of the vacuum frames, that is to say on motion of the left vacuum frame 13 out of the printing down station, it is possible for the left vacuum frame 13 to eject the previously printed foil and to receive a new foil.

However, it would also be possible to provide two adjacently placed foil cassettes, of which each would have half a load or charge. In this case there would be no reciprocating motion of the cassette. The same would apply for the receiving cassette. It would also be possible to have only one foil supply cassette 9, preferably fixed in a middle position, or a receiving cassette 12 and to move the vacuum frames 13 accordingly, for instance by means of curved guide rails. The frame holder then only needs one frame receiving means 18a.

The foil supply cassette 9 is in addition able to be moved upwards and downwards so that this makes possible engagement with the vacuum frame 13 received in the outer frame holder 18. The outer frame holder 18 may accordingly also be arranged to be stationary in the z direction. The frame holder 18, which is stationary in the x and y directions, is able to be moved in the z direction to the extent that the respectively moved vacuum frame 13 may be caused to engage with the blank plate on the plate table 3.

In order to shine light on the foil there is an illuminating device straddling the plate table 3 but not shown in detail. This device may have either two illuminating heads associated with the two adjacently placed frame receiving means 18a of the frame holder on the table side, or an illuminating head able to reciprocate by the distance between the two frame receiving means 18a.

In lieu of vacuum frame moving backwards and forwards while alongside each other it would also be possible to have vacuum frames arranged one after the other, which might be connected with each other. There would then have to be two foil cassettes, one foil cassette able to be moved into the two removing positions, associated with the vacuum frames. In place of foil cassettes it would naturally in any case (that is to say in the other working examples as well) be possible to have rest plates as foil receiving means with register members like cassettes and servers associated with the same, such servers being supplied from a cassette.

We claim:

1. A device for the production of printing plates comprising a printing down station with a plate table and an associated illuminating means, which station has associated with it a foil supply means formed preferably by a foil supply cassette for unprinted foil and preferably a receiving cassette for printed foil, in the case of which the foil to be printed onto an unexposed or blank printing plate is able to be taken from a foil supply means by means of a moving vacuum frame, is able to be moved onto the blank plate on the plate table and after exposure is able to be discharged, preferably into a receiving cassette, wherein a plurality of movable vacuum frames are travellingly arranged between the position of the foil receiving means, which is arranged clear of the plate table and is at a constant distance in relation to the plate table, and the plate table itself, such frames being arranged to move in circuits out of phase in relation to each other so that in each case one vacuum frame is adjacent to the foil receiving means, i.e. the foil receiving cassette, and another vacuum frame is in the printing down station.

2. The device as claimed in claim 1, wherein adjacent to the foil receiving means and the plate table, register members are provided adapted to be brought into engagement with the respectively arriving vacuum frames and wherein the vacuum frames are able to be brought into cooperating engagement with the film receiving means and, respectively, the plate table.

3. The device as claimed in claim 2, wherein respectively one frame holder having vacuum frame positioning means is associated with the foil receiving means and the plate table and in this holder the respectively arriving vacuum frame may be placed in true register, and the arriving vacuum frame, when in the inserted position in the respective frame holder is able to be cooperatingly associated with the associated foil receiving means and, respectively, the plate table.

4. The device as claimed in claim 1, wherein the vacuum frames, of which there are preferably two, are arranged to move reversingly on the respectively associated guide tracks running transversely in relation to the axis of illumination of the illuminating device.

5. The device as claimed in claim 3, wherein the guide tracks, which end adjacent to the mutually opposite side of the frame holders, are formed by rails, which have the same guide cross section as the frame holders.

6. The device as claimed in claim 1, wherein the frame holders running parallel to the illumination axis of the illuminating device are guided by guides running transversely in relation to the guide tracks.

7. The device as claimed in claim 1, wherein the frame holders placed adjacent to the inner and outer ends of the guide tracks are able to be moved through a distance at least equal to the distance between adjacent guide tracks arranged covering each other.

8. The device as claimed in claim 7, wherein the inner frame holder associated with the plate table is able to be moved between the guide tracks and is able to be lowered from each guide track as far as the plate table, which is stationary in the vertical direction and is preferably able to be moved parallel to the surface of the table.

9. The device as claimed in claim 7, wherein the outer frame holder associated with the foil cassette arrangement is only able to be moved between the guide tracks and wherein the foil cassette preferably arranged under the lowest guide track is able to be moved upwards and downwards and by lifting is able to be brought into cooperating relationship with the vacuum frame moved into the associated frame holder.

10. The device as claimed in claim 1, comprising a foil cassette, to which all vacuum farmes are able to be moved, and preferably comprising a number of receiving cassettes, equal to the number of guide tracks, such receiving cassettes being arranged thereunder.

11. The device as claimed in claim 1, comprising drag means which are associated with the guide tracks, are able to be driven in opposite directions and are able to be coupled with the respectively associated vacuum frame.

12. The device as claimed in claim 11, wherein in the case of there being two vacuum frames able to be received on mutually offset guide tracks, the drag means associated with the vacuum frames are in the form of the upper and lower runs of an endless loop of traction means, which is able to be reversingly driven.

13. The device as claimed in claim 11, wherein the drag means are respectively provided with an entraining means, with which a counter-holder of the respectively associated vacuum frame is able to be moved transversely in relation to the guide track plane into and out of engagement.

14. The device as claimed in claim 1, wherein the vacuum frames are able to be moved by means of a drag means, running in loop, on an endless guide track, which passes through the printing down station and along which one foil cassette and preferably a receiving cassette are arranged.

15. The device as claimed in claim 14, wherein the receiving cassette fits under the lower branch, leading away from the printing zone, of the endless guide track.

16. The device as claimed in claim 14, wherein between the endless guide track and the plate table and preferably between the endless guide track and the foil cassette there are respective frame holders adapted to move normally to the bottom planes of the table and the cassette and in which a respective vacuum frame is able to be received and located in true register therein.

17. The device as claimed in claim 1, wherein the frame orbits of the vacuum frames extend at the same level alongside each other at least adjacent to the plate table and preferably adjacent to the plate table and the foil cassette arrangement and wherein each frame holder adjacent to the end of frame orbits running alongside each other has a plurality of frame receiving means associated with a frame orbit.

18. The device as claimed in claim 17, wherein a foil cassette is provided which is able to be approached by each vacuum frame and which is able to be moved laterally through the distance between adjacent frame orbits.

19. The device as claimed in claim 17, wherein a receiving foil cassette is provided, which is able to be moved under the frame orbits and between same.

* * * * *